(12) United States Patent
Larsen et al.

(10) Patent No.: US 7,292,450 B2
(45) Date of Patent: Nov. 6, 2007

(54) HIGH DENSITY SURFACE MOUNT PART ARRAY LAYOUT AND ASSEMBLY TECHNIQUE

(75) Inventors: Jelena H. Larsen, Los Gatos, CA (US); Chee Kiong Fong, Cupertino, CA (US); Peter Anthony Atkinson, Sammamish, WA (US); Raul Rodriguez-Montanez, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 11/344,276

(22) Filed: Jan. 31, 2006

(65) Prior Publication Data

US 2007/0177364 A1    Aug. 2, 2007

(51) Int. Cl.
   *H05K 1/18* (2006.01)
(52) U.S. Cl. ............... 361/763; 361/760; 174/260
(58) Field of Classification Search ......... 361/760, 361/763, 363, 360; 174/260, 261, 264
See application file for complete search history.

(56) References Cited

U.S. PATENT DOCUMENTS

| | | | |
|---|---|---|---|
| 4,734,818 A * | 3/1988 | Hernandez et al. ...... 361/306.2 |
| 5,424,492 A | 6/1995 | Petty et al. |
| 5,455,456 A * | 10/1995 | Newman .................... 257/704 |
| 5,502,621 A | 3/1996 | Schumacher et al. |
| 6,194,979 B1 | 2/2001 | Bloom et al. |
| 6,337,798 B1 | 1/2002 | Hailey et al. |
| 6,418,032 B2 | 7/2002 | Hirata et al. |
| 6,429,388 B1 | 8/2002 | Interrante et al. |
| 6,509,530 B2 | 1/2003 | Pearson et al. |
| 6,512,680 B2 | 1/2003 | Harada et al. |
| 6,664,628 B2 | 12/2003 | Khandros et al. |
| 6,724,638 B1 | 4/2004 | Inagaki et al. |
| 6,882,045 B2 | 4/2005 | Massingill et al. |
| 6,893,899 B2 | 5/2005 | Wehrly et al. |
| 2003/0089522 A1 | 5/2003 | Dances |
| 2004/0125580 A1 | 7/2004 | Chung et al. |
| 2005/0087850 A1* | 4/2005 | Nishikawa et al. ......... 257/678 |
| 2006/0103004 A1* | 5/2006 | Sakai et al. ................. 257/700 |

FOREIGN PATENT DOCUMENTS

| | | |
|---|---|---|
| EP | 0379624 | 1/1989 |
| JP | 2005-277115 | * 10/2005 |

OTHER PUBLICATIONS

Designing With Fineline BGA Packages for APEX, FLEX, ACEX, MAX 7000 & MAX 3000 Devices; Oct. 2005, ver. 3.0; Altera Corporation; 101 Innovation Drive, Sn Jose, CA 95134; http://www.altera.com/literature/an/an114.pdf.
Chris M. Mueth, Agilent Technologies EEsof-EDAUsing Ball Grid Array Packaging in Wireless IC Designs; vol. 6, Issue 1 2001; http://www.measurement.tm.agilent.com/index.cgi?CONTENT_ID=661.
Doug Trobough; IC Density Drives Array Packages; http://www.eetimes.com/editorial/1998/packaging9808.html.
Nils Heininger; Polymer Stencils for Wafer Bumping; Surface Mount Technology (SMT) Jun. 2001; http://smt.pennnet.com/Articles/Article_Display.cfm?Section=Archives&Subsection=Display&ARTICLE_ID=104694.
Paul Bickerdyke, Australian Electronics Engineering; The Route To High-Density Design; Jun. 21, 2002; http://www.ferret.com.au/articles/5f/0c00e05f.asp.

* cited by examiner

*Primary Examiner*—Michael C. Zarroli

(57) ABSTRACT

A printed wiring assembly comprising, a printed wiring board, a ball grid array coupled to the printed wiring board, and a high density surface mount part array disposed on the printed wiring board.

14 Claims, 5 Drawing Sheets

PRIOR ART

101

High Density Surface
Mount Part Array
213

301

HIGH DENSITY SURFACE MOUNT PART ARRAY LAYOUT AND ASSEMBLY TECHNIQUE

TECHNICAL FIELD

This description relates generally to printed wiring assemblies including integrated circuits and more specifically to printed wiring assemblies having ball grid arrays disposed thereon.

BACKGROUND

With decreasing size of the packages used to house integrated circuits, the layout of printed wiring boards ("PWB's") tends to become more crowded as well. A trend is to crowd more parts closer together. In such situations it may be difficult to provide sufficient bypassing on power supply lines coupled to the integrated circuits. Insufficient bypassing may limit the frequency response of the printed wiring board ("PWB"). Crowding the parts can also cause manufacturing difficulties such as tombstoning and the like.

FIG. 1 shows a conventional printed wiring board feed-through, pad and bypass capacitor (or "bypass cap") layout 101. Today's layout techniques typically allow about 115 surface mount 0.0402 components per square inch due to the standard layout of solder pad and vias on a conventional printed wiring board. This pad/feed-through hole printed wiring board layout is typical of printed wiring layouts on the side of the printed wiring board that is opposite to the ball grid array ("BGA") package. As shown a single pattern of a pair of feed-through holes and a pair of pads are stepped and repeated to form a printed wiring layout. Each set of pads allows mounting of a single bypass capacitor to the printed wiring board.

Dense packing may constrain the placement of bypass components on a printed wiring board. Traces are often fanned out away from the package to fit components into the space available. Also the close spacing of pads that couple to a ball grid array can limit the size and placement of feed-through holes utilized to carry signals between layer of the printed wiring board.

SUMMARY

The following presents a simplified summary of the disclosure in order to provide a basic understanding to the reader. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

The present example provides a high density surface mount part array. A high density surface mount parts array typically provides a circuit trace patern on a printed wiring board coupled to ball grid array pins via feed-through holes ("vias"). In an example a 0.1 mil ball grid array is provided. In the instant application the feed-through holes may be disposed at the side of a circuit trace pad, or at the end of the circuit trace pad. In an example a 22 mil via is provided. The pads are typically designed accommodate a pair of capacitors (or "caps") coupled to the printed wiring board by solder paste chosen to prevent tombstoning of the capacitors.

The capacitors are typically provided to filter power being applied to the ball grid array IC. The effectiveness of the filtering tends to be increased by the high density layout, and the use of capacitors disposed in parallel. Thus, a high density surface mount parts array is provided for the capacitors that tends to be commercially manufacturable, and provides sufficient power supply filtering.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Although the present examples are described and illustrated herein as being implemented in a ball grid array system, the system described is provided as an example and not a limitation. As those skilled in the art will appreciate, the present examples are suitable for application in a variety of different types of integrated circuit systems.

Figure 1:
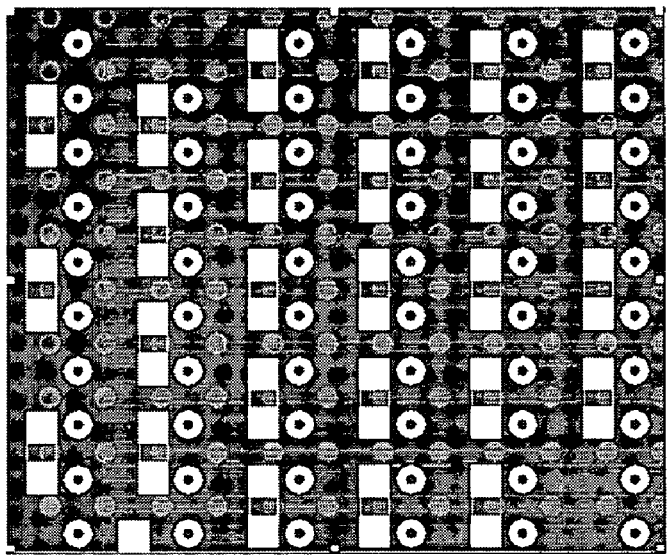
FIG. 1 shows a conventional printed wiring board feed-through, pad and bypass capacitor layout.
Figure 2:
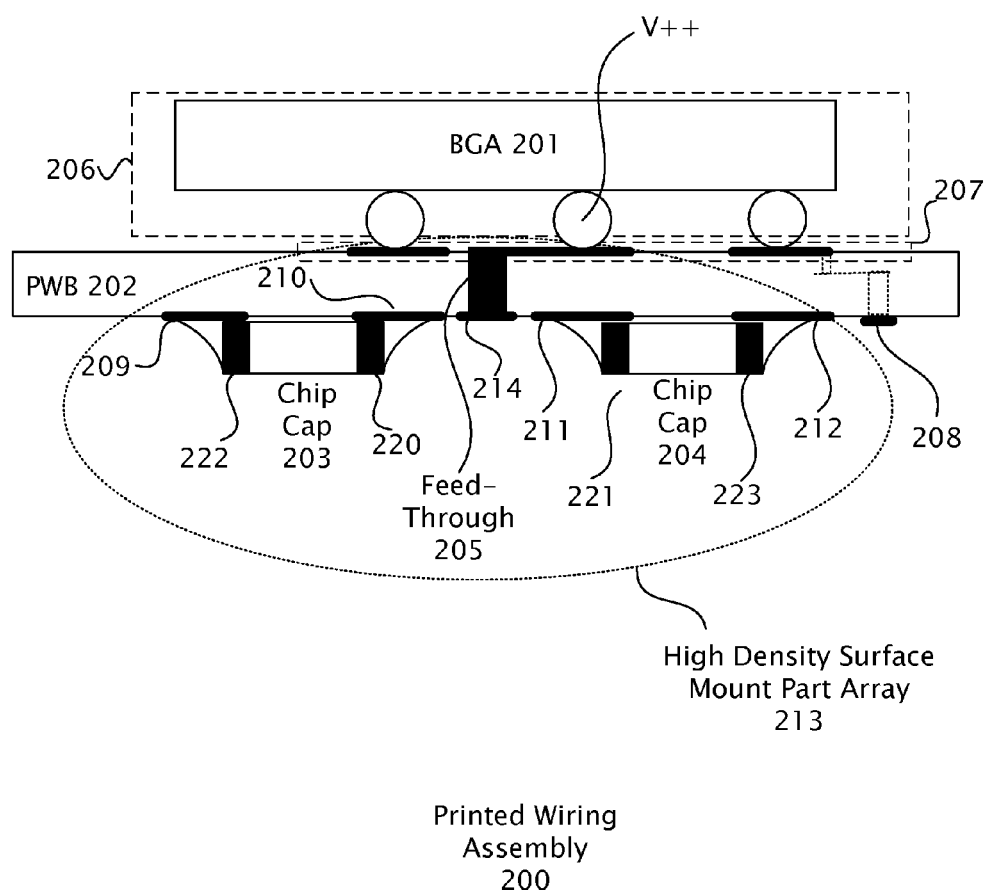
FIG. 2 shows a printed wiring assembly having a high density surface mount part array.

FIG. 2 shows a printed wiring assembly having a high density surface mount part array. As shown a high density surface mount part array 213 may be disposed upon a PWB 202, that may include other components, to form a PWB assembly having a high density surface mount part array 213. Power hungry high speed BGA (Ball Grid Array) chips typically have power delivery and noise suppression problems. High speed ICs typically utilize large amounts of DC power to provide improved performance, including increased speeds. A high density surface mount part array may tend to promote power supply noise suppression providing a compact printed wiring layout that tends to be manufacturable.

Power may be supplied to an IC through one or more pins, pads or the like. Typically one or more voltages are supplied to one or more pins, and grounds are also typically supplied on one or more pins. In a ball grid array IC the electrical connections may be supplied through pads on the back and/or sides of the ball grid array package. Power supplied to the printed wiring board typically enters the chip in the ball grid array package through matching pads on the ball grid array, and the printed wiring board. The matching pads are typically coupled via a solder connection. Ball grid array packages typically allow dense component packing on a printed wiring assembly due to their form factor that typically allows connections under the package. Ball grid array packages may be soldered directly to the printed wiring board, or mounted in a socket.

In some applications, ICs are often placed in sockets to aid manufacturing and maintenance of printed wiring assemblies. However, sockets tend to increase the distance from printed wiring assembly components such as bypass capacitors and the IC. Sockets may also introduce uncontrolled reactances into the bypass circuitry that may interfere with the removal of noise.

Bypass capacitors may be used to filter noise on the power supply lines. Typically the high currents utilized in ICs tend to increase noise generated in printed wiring power distribution. In such situations bypass capacitors may be used to shunt power supply noise to ground before it enters the IC. To effectively remove noise on the power supply lines prior to application to the IC, bypass components are typically placed as close to the package as possible.

Bypass capacitors are typically chosen to have near zero lumped series reactance at nuisance frequencies. However at high frequencies typically encountered in bypassing noise, the distributed properties of the capacitor can predominate. Hence series inductance shown in the distributed model of a capacitor can predominate blocking the noise from being shunted to ground. The series inductance of a capacitor typically is a fixed property of the capacitor package and the given capacitor value.

Parallel inductors typically present a lower series reactance. Thus by placing two capacitors in parallel, the distributed series inductance inherent in the bypass capacitor is lessened, lowering the impedance so the noise may be more easily shunted to ground.

Aside from the desired electrical effects that may be provided by a high density surface mount part array, manufacturing considerations should be taken into consideration. Printed wiring assemblies that may include ball grid arrays may be assembled in conformance with IPC-A-610C, Acceptability of Electronic Assemblies. Certain aspects of the assembly process are provided in the following paragraphs.

Surface mount component packages, such as bypass caps, typically allow a compact printed wiring layout to be produced. Surface mount components typically do not have leads. Typically an end cap on the component is utilized to couple the component to the circuit, typically through a solder connection.

Solder may be applied to a printed wiring board as a solder paste, by a screening process. The surface mount components may be applied to the board by a pick and place operation, with the wet solder paste holding the placed components in place. Once all the desired components are placed the board may be heated by an IR reflow method or the like to create a permanent solder joint.

During a heating process the solder paste melts and pools around the component. Fluxes in the paste may aid in wetting to produce a satisfactory solder joint. When the solder melts the component typically is floating in a pool of molten solder until the board cools. While molten the component may move from its original placement due to surface tension created by the molten solder. If the pads have been properly designed the component tends to self center if the surface tension at each end cap (or "terminal") of the capacitor is approximately equal.

However, some pad arrangements result in unequal surface tension that may actually cause one end of the component to be lifted off of the board. This problem is called "tombstoning" and can cause rework to be needed. Tombstoning may be avoided by proper design of the pads, solder mask, adjacent feed-through holes and the like. Also, the selection of solder paste can eliminate tombstoning for an existing printed wiring layout.

Feed-through holes can draw solder away from a circuit pad causing uneven surface tension, and possibly tombstoning. Accordingly the placement of a feed through hole can affect the manufacturability of a printed wiring assembly. In ball grid arrays coupled to printed wiring assembly feed-throughs are typically utilized to aid in fanning out signal lines so that all of the signal lines are not constrained to be on a single layer. Feed-throughs may be of many types, including direct feed-throughs and indirect feed-throughs. Feed-throughs typically include one or more pads in the form of an annular ring, which is coupled to a barrel. The barrel is the plating that lines a hole drilled in the board to accommodate the electrical connection formed by the barrel.

Electrical and manufacturing issues may be addressed in the printed wiring assembly 200 having a high density surface mount part array 213.

The high density surface mount part array 213 includes a feed-through 205 coupling a power supply pin of the BGA 201, at one end, and to filter capacitors 203, 204 on the opposite side of the board. The feed-through of the high density surface mount part array is designed to have specific properties. The capacitors 203, 204 are coupled to the printed wiring board 202, at specially configured pads 209, 210, 211, 212. The capacitors are coupled to the pads through solder connections created by one or more solder pastes that tend to prevent tombstoning.

The printed wiring assembly 200 may include the high density surface mount part array 213, and various passive and active components. For example: resistors, capacitors, inductors, distributed microwave components, connectors, sockets, analog ICs, digital ICs and the like. The PWB assembly may be fabricated according to various standards, including those promulgated by private standards bodies, the military, or others.

The BGA 201 may house a central processing unit ("CPU"), a graphics processing unit ("GPU") or other type of circuit. An exemplary BGA package may be a 0.1 mil ball grid array. A number of IC packages could be substituted for the ball grid array; for example a quad flat pack, a BGA with wire bonds, a BGA in a flip chip configuration, a chip scale package, a chip on board, a ceramic ball grid array, a ceramic column grid array and the like. In short the high density surface mount part array may be utilized in many high density applications.

A ball grid array IC 201 is typically coupled to a printed wiring board 202 by a plurality of solder connections 206. Typically solder balls are used in this configuration, however other equivalent methods of connection may be utilized. The solder connections typically couple to the PWB 202 at a plurality of pads 207. The pads carry the electrical connections, typically through traces, to desired locations on the PWB 202. Feed-throughs 205, 208 may be used to carry the electrical connection to the opposite side of the PWB, or to any internal layers that may be present. In the case of power supply connections to the IC a feed-through of the high density surface mount part array 213 may be utilized to carry the trace to the side of the board opposite the BGA 201.

The PWB 202 is a conventionally constructed PWB that typically includes one or more layers of circuit traces. The PWB may also be a flex circuit. For example, the PWB may be double sided or multilayered. The materials that make up the PWB may include glass epoxy, phenolic, polyamide, Teflon-glass, and the like. In the example provided the PWB may include pads that couple to a ball grid array package. The PWB typically routes power and ground to various parts on a printed wiring assembly, including ICs such as a ball grid array.

Feed-through 205 is a component of the high density surface mount part array, and is typically provided to electrically couple a pad of the ball grid array 207, on a first side of the printed wiring board to a trace, or pad, on a second side of the printed wiring board. The feed through on the second side of the printed wiring board includes a pad formed in the shape of an annular ring 214, having dimensions and a spacing from other traces, or pads that tends to prevent tombstoning, and allows one or more bypass capacitors 203, 204 to be positioned close to the BGA pad 201 to provide satisfactory bypassing. This feed through is typically coupled to a plurality of bypass capacitors 203, 204 at a first terminal of each capacitor, and to a trace that supplies a bias voltage to the IC contained in the BGA.

Feed-through 208 is an alternative form of feed-through that may be substituted for feed-through 205. It is conventionally constructed to couple to a trace disposed in an interior layer in a multilayer printed wiring board between a ball grid array pad and a chip capacitor terminal.

Chip caps 203, 204 are equivalently termed bypass-caps, shunt caps, filter caps and the like. The caps are typically surface mount parts, and are chosen to have the smallest footprint practicable. The caps may be made from a variety of materials such as ceramic, glass, tantalum, electrolytic dielectric, or the like. Alternatively, chip caps with ribbon leads may be substituted for those having standard end caps. In an example EIA standard 0402 capacitors are used since they provide a small package size and the desired capacitance. Alternatively, surface mount filters may be substituted for the capacitors.

Pads 209, 210, 211, 212 are part of the high density surface mount part array 213. The pads 209, 210, 211, 212 are provided for the attachment of the first and second capacitor terminals of the capacitors 203, 204. The pads are disposed on the printed wiring board 202, and have dimensions that tend to prevent tombstoning during soldering and allow close placement of chip capacitors to the feed-through, and/or desired ball grid array pad 207. Typically the pads 210, 211 are the first set of pads, and closest to the feed-through 205 are coupled to a voltage supply trace, or voltage supply plane. Typically the pads 209, 212, are the second set of pads and couple the second set of capacitor terminals to a ground trace, or plane.

The solder paste that may be used to achieve the high density capacitor array includes: Shenmao PF606-P, Tamura TLF-206-93F, and the like. When heated the solder paste forms the electrical connection coupling the first end cap of chip capacitor 203 to the a first pad 210 of the first set of pads 210, 211 on the printed wiring board 202 A joint coupling the first end cap of chip capacitor 204 to the a second pad 211 of the first set of pads 210, 211 on the printed wiring board 202 is also formed. A joint coupling the second end cap of chip capacitor 203 to the a first pad 209 of the second set of pads 209, 212 on the printed wiring board 202 is also formed. And finally a joint coupling the second end cap of chip capacitor 204 to the a second pad 212 of the second set of pads 209, 212 on the printed wiring board 202 is also formed. Thus, resizing the solder pad size in conjunction with the specific solder paste can allow placement of twice the SMT components on the back side of a BGA.

Figure 3:
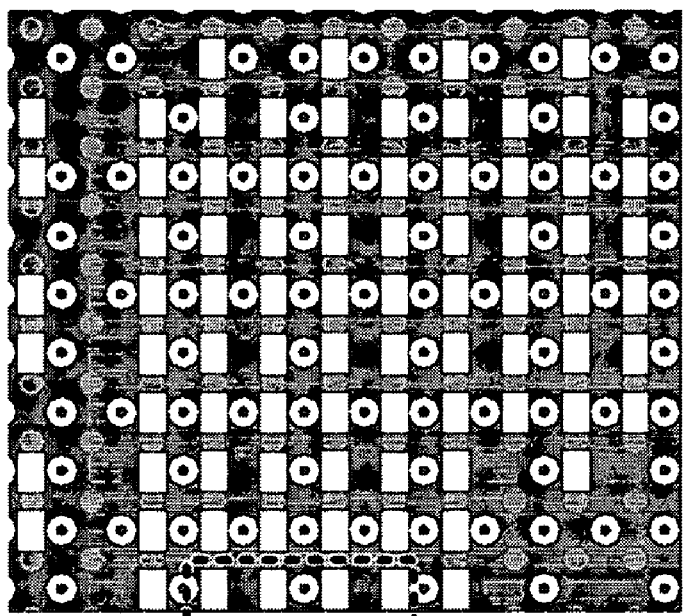
FIG. 3 shows a printed wiring board feed-through, pad and bypass capacitor layout according to a high density surface mount part array.

FIG. 3 shows a printed wiring board feed-through, pad and bypass capacitor layout 301 incorporating a high density surface mount part array 213. The examples provided may allow an increase of up to 234 surface mount 0.0402 EIA size code (0.040" long by 0.002" wide) components (not shown) per square inch. Increased density may be achieved by resizing the solder pads and using the solder paste with the particular materials composition. Typically 0.0402 components are one of the smaller surface mount components available. However, other equivalent components may be substituted for the 0.0402 components.

Figure 4:
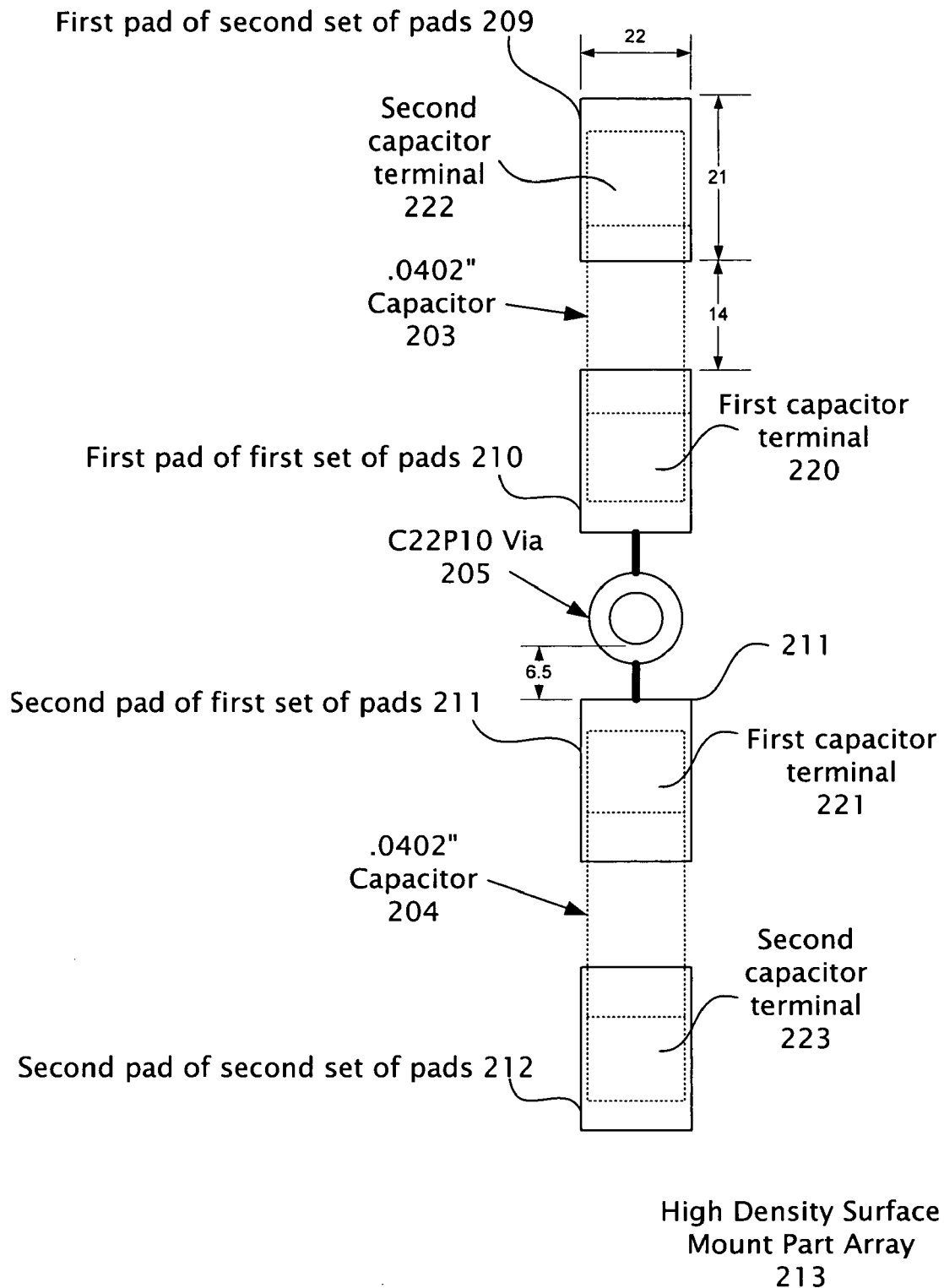
FIG. 4 shows an example of a high density surface mount part array suitable for use with a ball grid array packaged graphics processing unit ("GPU").

FIG. 4 shows an example of a high density surface mount part array 213 suitable for use with a ball grid array packaged graphics processing unit ("GPU"). The units shown are in mils. In this example the first chip cap 203, and the second chip capacitor 204 are disposed in an end to end configuration. Some BGA GPUs may have a pin out pattern that may utilize the pattern shown. Here the pads 209, 210, 211, 212 have a width of 22 mils, and a length of 21 mils. Pads coupled to a common capacitor are separated by a distance of 14 mils. The feed-through, is a C22P10 via that is coupled to the first pad of the first set of pads 210 and the second pad of the first set of pads 211. The feed-through typically couples a BGA power supply pin to a power source present on the printed wiring board. The edge of the pads nearest to the feed-through is spaced 6.5 mils from the edge of the feed-through hole. The first and second pads of the second set of pads 209, 212 are coupled to ground. In this example 0.0402 capacitors 203, 204 are used.

Figure 5:
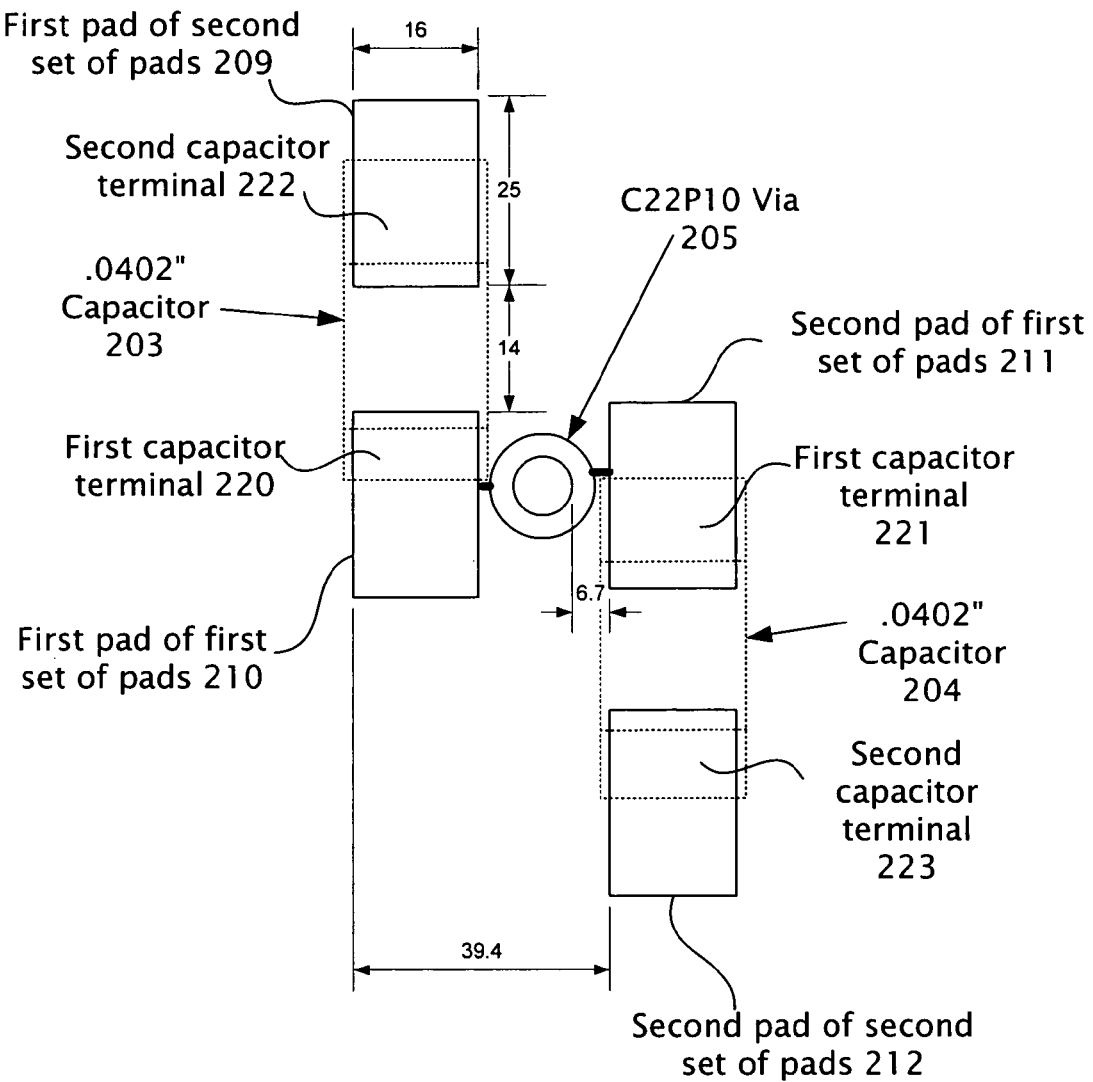
FIG. 5 shows an alternative example of a high density surface mount part array suitable for use with a ball grid array packaged central processing unit ("CPU").

FIG. 5 shows an alternative example of a high density surface mount part array suitable for use with a ball grid array packaged central processing unit ("GPU"). The units shown are in mils. In this example the first chip cap 203, and the second chip capacitor 204 are disposed in a partial lateral configuration. Some BGA GPUs may have a pin out pattern that may utilize the pattern shown. Here the pads 209, 210, 211, 212 have a width of 16 mils, and a length of 25 mils. Pads coupled to a common capacitor are separated by a distance of 14 mils. The feed-through, is a C22P10 via that is coupled to the first pad of the first set of pads 210 and the second pad of the first set of pads 211. The feed-through typically couples a BGA power supply pin to a power source present on the printed wiring board. The edge of the pads nearest to the feed-through is spaced 6.7 mils from the edge of the feed-through hole. The first and second pads of the second set of pads 209, 212 are coupled to ground. In this example 0.0402 capacitors 203, 204 are used with the pads slightly undersized for the part.

The invention claimed is:

1. A printed wiring assembly comprising:
   a printed wiring board;
   a ball grid array coupled to the printed wiring board; and
   a high density surface mount part array disposed on the printed wiring board in which the high density surface mount part array includes:
      a feed-through hole electrically coupled to a first pad of a first set of pads and electrically coupled to a second pad of a first set of pads in an end to end configuration and electrically coupled to a power pin of the ball grid array and electrically coupled to a power supply trace;
      a first chip capacitor having a first terminal coupled to the first pad of the first set of pads;

a second chip capacitor having a first terminal coupled to the second pad of the first set of pads; and a solder paste disposed on the first printed wiring pad and the second printed wiring pad to couple the first terminal of the first chip capacitor to the first printed wiring pad and to couple the first terminal of the second chip capacitor to the second printed wiring pad.

2. The printed wiring assembly of claim 1 in which the first chip capacitor further comprises a second terminal of the first chip capacitor coupled to ground.

3. The printed wiring assembly of claim 1 in which the second chip capacitor further comprises a second terminal of the second chip capacitor coupled to ground.

4. The printed wiring assembly of claim 1 in which the first pad of the first set of pads, the second pad of the first of pads, the first pad of the second set of pads, and the second pad of the second set of pads are rectangular and measure 22 mils by 21 mils.

5. The printed wiring assembly of claim 4 in which an edge of the first pad of the first set of pads is 6.5 mils from an edge of a hole in the feed-through, and an edge of the second pad of the first set of pads is 6.5 mils from an edge of the hole in the feed-through.

6. The printed wiring assembly of claim 5 in which the first pad of the second set of pads is 14 mils from the second pad of the first set of pads, and the first pad of the first set of pads is 14 mils from the second pad of the first set of pads.

7. The printed wiring assembly of claim 6 in which the first chip capacitor is a 0402 type capacitor, and the second chip capacitor is a 0402 type capacitor.

8. A printed wiring assembly comprising:

a printed wiring board;

a ball grid array coupled to the printed wiring board; and a high density surface mount part array disposed on the printed wiring board in which the high density surface mount part array includes:

a feed-through hole electrically coupled to the side of a first pad of a first set of pads and electrically coupled to the side of a second pad of a first set of pads in a partial lateral configuration and electrically coupled to a power pin of the ball grid array and electrically coupled to a power supply trace;

a first chip capacitor having a first terminal coupled to the first pad of the first set of pads;

a second chip capacitor having a first terminal coupled to the second pad of the first set of pads; and a solder paste disposed on the first printed wiring pad and the second printed wiring pad to couple the first terminal of the first chip capacitor to the first printed wiring pad and to couple the first terminal of the second chip capacitor to the second printed wiring pad.

9. The printed wiring assembly of claim 8 in which the first chip capacitor further comprises a second terminal of the first chip capacitor coupled to ground.

10. The printed wiring assembly of claim 8 in which the second chip capacitor further comprises a second terminal of the second chip capacitor coupled to ground.

11. The printed wiring assembly of claim 8 in which the first pad of the first set of pads, the second pad of the first set of pads, the first pad of the second set of pads, and the second pad of the second set of pads are rectangular and measure 16 mils by 25 mils.

12. The printed wiring assembly of claim 11 in which an edge of the first pad of the first set of pads is 6.7 mils from an edge of a hole in the feed-through, and an edge of the second pad of the first set of pads is 6.7 mils from an edge of the hole in the feed-through.

13. The printed wiring assembly of claim 12 in which the first pad of the second set of pads is 14 mils from the second pad of the first set of pads, and the first pad of the first set of pads is 14 mils from the second pad of the first set of pads.

14. The printed wiring assembly of claim 13 in which the first chip capacitor is a 0402 type capacitor, and the second chip capacitor is a 0402 type capacitor.

\* \* \* \* \*